United States Patent
Nishimiya et al.

(10) Patent No.: US 6,577,486 B1
(45) Date of Patent: Jun. 10, 2003

(54) STACKED-TYPE ELECTRONIC DEVICE HAVING FILM ELECTRODE FOR BREAKING ABNORMAL CURRENT

(75) Inventors: Yukio Nishimiya, Sendai (JP); Syuji Aisawa, Sendai (JP); Shinji Ito, Sendai (JP); Masayuki Kurano, Hyogo (JP)

(73) Assignees: NEC Tokin Corporation, Sendai (JP); NEC Tokin Ceramics Corporation, Shiso-gun (JP)

( * ) Notice: Subject to any disclaimer, the term of this patent is extended or adjusted under 35 U.S.C. 154(b) by 0 days.

(21) Appl. No.: 09/601,439

(22) PCT Filed: Dec. 3, 1999

(86) PCT No.: PCT/JP99/06805
§ 371 (c)(1),
(2), (4) Date: Jul. 31, 2000

(87) PCT Pub. No.: WO00/33334
PCT Pub. Date: Jun. 8, 2000

(30) Foreign Application Priority Data

Dec. 3, 1998 (JP) .................................. 10-344337
Dec. 4, 1998 (JP) .................................. 10-345399
Jun. 17, 1999 (JP) .................................. 11-171086

(51) Int. Cl.[7] ................................. H02H 5/00
(52) U.S. Cl. .................. 361/104; 361/58; 361/103
(58) Field of Search .......................... 361/103, 104, 361/58, 270, 119, 113, 115

(56) References Cited

U.S. PATENT DOCUMENTS

| 4,539,620 | A |   | 9/1985 | Gray ........................... 361/275 |
| 4,680,670 | A |   | 7/1987 | Chan ........................... 361/275 |
| 5,707,555 | A | * | 1/1998 | Ohtani ........................ 252/514 |
| 5,781,402 | A | * | 7/1998 | Fujiyama et al. ........... 361/305 |
| 6,198,618 | B1 | * | 3/2001 | Ohtani et al. ............ 361/306.3 |

FOREIGN PATENT DOCUMENTS

| JP | 63-305506 | 12/1988 | ............ H01G/1/11 |
| JP | 3-1514 | 1/1991 | ............ H01G/1/11 |

OTHER PUBLICATIONS

Patent Abstracts of Japan, vol. 014, No. 244 (E–0932) May 24, 1990; JP 02 067707 A (NEC Corp.), Mar. 7, 1990.

* cited by examiner

Primary Examiner—Stephen W. Jackson
(74) Attorney, Agent, or Firm—Frishauf, Holtz, Goodman & Chick, P.C.

(57) ABSTRACT

A stacked-type capacitor with a fuse function for breaking an abnormal current wherein internal electrodes of a same polarity stacked in a ceramic body are led out to an outer surface of the ceramic body through lead-out electrodes. The lead-out electrodes have end surfaces exposed in the outer surface of the ceramic body. A film electrode for fuse function is formed on the outer surface to overlie the end surfaces of the lead-out electrodes and to be connected to an external electrode formed on the ceramic body. The film electrode is made from metallic powder and/or metallo-organic compound paste. The paste can contain powder of glass forming elements.

29 Claims, 18 Drawing Sheets

STACKED-TYPE ELECTRONIC DEVICE HAVING FILM ELECTRODE FOR BREAKING ABNORMAL CURRENT

TECHNICAL FIELD

This invention relates to a stacked-type electronic device such as a stacked-type ceramic capacitor, a stacked-type piezoelectric ceramic actuator, and others having a ceramic body with a plurality of internal electrodes and an external electrode formed on the ceramic body and connected, as a lead terminal, to the internal electrodes, and, in particular, to such a stacked-type ceramic device having a fuse element for breaking abnormal current.

BACKGROUND ART

A typical one of the stacked type electronic devices is a ceramic capacitor which comprises a ceramic body of a ceramic material with first and second sets of internal electrodes and first and second external electrodes formed on the ceramic body at different positions. The first set of internal electrodes and the second set of internal electrodes are alternately disposed in the ceramic body and spaced from each other by the ceramic material. The first and second sets of internal electrodes are connected to the first and second external electrodes are connected to the first and second internal electrodes. The first and second external electrodes serve as lead terminals for connecting the capacitor to an external circuit.

The first set of internal electrodes and the second set of internal electrodes will often be referred to as first internal electrodes and second internal electrodes, respectively, hereinafter.

In production of the ceramic capacitor, first and second internal electrodes are formed by screen printing method on ceramic green sheets respectively. Then, green sheets having first internal electrodes and green sheets having second internal electrodes are alternately stacked to form a ceramic body. The ceramic body is fired or baked to form a hard ceramic body having the first and second internal electrodes. Then, external electrodes are formed on the ceramic body.

In the stacked-type capacitor, when adjacent ones of the first and second internal electrodes are short-circuited by any fault, for example, pin holes existing in the ceramic body, an abnormal current flows between the first and second external electrodes through the short-circuited internal electrodes to cause destruction of the external circuit as well as the capacitor itself. This is a serious problem.

The stacked-type piezoelectric ceramic actuator has a similar structure of the capacitor as described above. The ceramic material is a piezoelectric material and is polarized between the adjacent first and second internal electrodes. The stacked-type piezoelectric ceramic actuator has also the similar problem.

Generally speaking, the electronic devices having a ceramic body with a plurality of internal electrodes connected to an external electrode also suffers from the similar problem.

In order to resolve the problem, JP-A 63-305506 (Reference I) discloses to form a narrow width portion in each of the internal electrodes adjacent the external electrode. The narrow width portion is referred to as a fuse electrode. The fuse electrode is melted and broken out by the Joule heat caused by the abnormal electrode flowing therethrough.

However, there is another problem that the Jule heat may cause the ceramic body itself cracked.

JP-A 3-1514 (Reference II) discloses to use a wire-shape fuse element for connecting the internal electrodes with the external electrode. An outer electrode is formed on an outer surface of the ceramic body and is connected to the internal electrodes. The outer electrode is connected to the external electrode by the wire-shape fuse element.

It is troublesome that the wire-shape fuse element extends on the outer surface of the ceramic body. Further, when a pair of adjacent internal electrodes is only short-circuited, the fuse element is broken out. This means the capacitor can no longer be used.

OBJECT OF THE INVENTION

Therefore, it is an object of this invention to provide a stacked-type ceramic electronic device having a plurality of internal electrodes connected to an external electrode and a fuse function for protecting against abnormal current, wherein that ones of the internal electrodes through which the abnormal current flows are only removed or separated by the fuse function from the connection between the internal electrodes and the external electrode without any crack being caused in the ceramic body, so that the device can then be operable while still maintaining its electronic properties.

It is another object of this invention to provide the stacked-type ceramic electronic device with the fuse function which is of a surface mount type.

It is another object of this invention to provide the stacked-type electronic device with the fuse function which has an improved equivalent series resistance.

DISCLOSURE OF INVENTION

According to the present invention, a stacked-type electronic device is obtained which comprises:

a ceramic body of a ceramic material having an outer surface including a side surface;

a set of internal electrodes disposed in the ceramic body and spaced from each other by the ceramic material, the internal electrodes extending in parallel with each other, the internal electrodes having their individual lead-out electrodes extending therefrom to their end surfaces exposed in the side surface;

an external electrode mounted on the ceramic body for connecting to an external electric circuit;

a film electrode connected to the external electrode, the film electrode being deposited on the side surface and overlying the end surfaces of the individual lead-out electrodes in common to be directly connected to the lead-out electrodes.

At least, the film element partially fuses by a heat caused due to an abnormal current flowing therethrough from the external electrode to a particular one of the internal electrodes to break the abnormal current from flowing to the particular internal electrode.

In an aspect, the film electrode comprises metallic material having a melting point lower than that of the internal electrodes.

In an embodiment, the film electrode has a thickness of 0.5–50 micrometers ($\mu$m). Each of the lead-out electrodes has a width of 50–800 micrometers ($\mu$m).

In an example, it can make use of metals or alloys selected from a group of Ag, Pd, Cu, Ni, Sn, Zn, Bi, Pb and Cd for the metallic material of the film element.

In a preferred embodiment, the film electrode is a baked film formed by an electrode metal paste being coated on the side surface and then baked.

Preferably, the electrode metal paste is a metallic powder paste comprising electrode metallic powder and a carrier solvent suspending the powder therein.

More preferably, the metallic powder paste further contains at least one selected from glass forming elements of $SiO_2$, $Al_2O_3$ and $B_2O_3$.

Alternatively, the electrode metal paste is an metallo-organic compound past which comprises resinate of metallo-organic compound/organometallic compound and organic solvent resolving the resinate therein. The reginate of the metallo-organic compound/organometallic compound is one comprises the metallo-organic compound/organometallic compound and resin mixed to the the metallo-organic compound/organometallic compound.

The metallo-organic compound preferably contains at least one of glass forming elements of Si, Al, and B.

The electrode metal paste may be a mixed paste which comprises the metallic powder paste and the metallo-organic compound paste mixed with the metallic powder paste. It is preferable that the metallic powder paste further contains at least one selected from glass forming elements of $SiO_2$, $Al_2O_3$ and $B_2O_3$, or the metallo-organic compound may contain at least one of glass forming elements of Si, Al, and B.

In an embodiment of the stacked-type electronic device according to this invention, the external electrode overlaps the film electrode. The external electrode and the film electrode can be made of the same material.

Alternatively, the external electrode and the film electrode can be spaced from each other by a hollow space formed therebetween, or an insulating glass layer may partially be interposed between the external electrode and the film electrode.

In another embodiment, the external electrode is formed at a position on the outer surface generally different from the film electrode.

In the embodiment, the external electrode and the film electrode are located at spaced positions on the outer surface, and a connecting electrode is deposited on the outer surface between the spaced positions and connecting the external electrode with the film electrode.

Alternatively, the external electrode and the film electrode are partially but slightly overlapped to each other. The film electrode is covered with a protective glass layer. The protective glass layer has a melting point lower than that of the film electrode but is higher than a soldering temperature for soldering the external electrode to the external circuit.

In the stacked-type electronic device of this invention as described above, the side surfaces, the set of internal electrodes, the lead-out electrodes, the external electrode and the film electrode are a first side surface, a first set of internal electrode, first lead-out electrodes, a first external electrode, and a first film electrode, respectively. The device may further comprise a second set of internal electrodes disposed in the ceramic body having their individual second lead-out electrodes with their ends exposed in the outer surface at positions spaced from the first lead-out electrodes and the first external electrode, and a second external electrode formed on the ceramic body and spaced from the first lead-out electrodes and the first external electrode. But the second external electrodes are electrically connected to the second set of internal electrodes in common.

The stacked-type electronic device may further comprises a second film electrode connected to the second external electrode. The second film electrode is deposited on the outer surface and overlying the ends of the individual second lead-out electrodes in common to be directly connected to the second lead-out electrodes. At lest the second film electrode may partially fuse by a heat caused due to an abnormal current flowing therethrough from the second external electrode to a particular one of the second set of internal electrodes to break the abnormal current from flowing to the particular one of the second set of internal electrode.

The outer surface may comprise the first side surface and two opposite end surfaces at opposite ends of the first side surface, and the first and second external electrodes are formed on the first and second end surfaces.

The second lead-out electrodes are exposed in the first side surface. A distance between the second lead-out electrodes and the second external electrode is same as another distance between the first lead-out electrodes and the first external electrode.

Alternatively, the outer surface further comprises a second side surface disposed opposite to the first side surface and between the first and second end surfaces. The second lead-out electrodes are exposed in the second side surface.

Further, a first and a second dummy film electrodes may be disposed on the second and the first side surfaces opposite to each other and at positions opposite to the first and the second film electrodes, respectively.

An example of the stacked-type electronic device according to this invention is a stacked-type capacitor wherein each of the first set of internal electrodes and each of the second set of internal electrodes are alternatively disposed in the ceramic body.

Another example of the stacked-type electronic device according to this invention is a stacked-type piezoelectric ceramic actuator wherein each of the first set of internal electrodes and each of the second set of internal electrodes are alternatively disposed in the ceramic body, and the ceramic body is polarized in a stacked direction between adjacent electrodes.

BEST MODE FOR CARRYING OUT THE INVENTION

Figure 1:
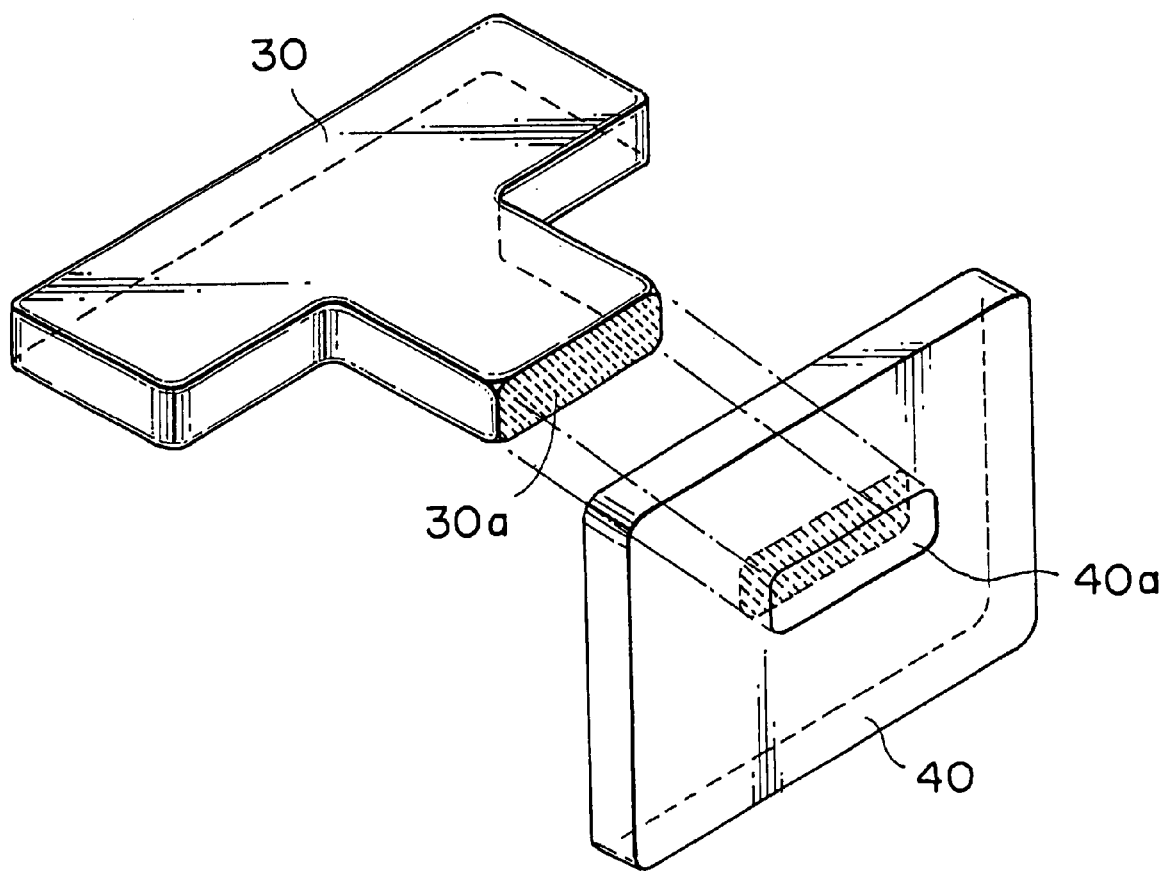
FIG. 1 is a perspective view illustrating a connection of an internal electrode and a film electrode for describing the fuse function thereof in a stacked-type ceramic capacitor of this invention.

Referring to FIG. 1, the fuse function of the stacked-type ceramic electronic device of this invention will at first be described. As shown in the figure, an internal electrode 30 has a lead-out electrode 30a extending therefrom to a side of a ceramic body which is not shown but will later be described. An end surface of the lead-out electrode 30a, which is shown by a dotted region, is brought into contact with and connected to a surface of a film electrode 40, as shown in an imaginary line. A portion of the film electrode 40 connected to the lead-out electrode 30a is shown at 40a.

When an abnormal current flows through the connection between the lead-out electrode 30a and the connected portion 40a, the connected portion 40a is melted so that the connection between the internal electrode 30 and film electrode 40 is broken down. Thus, the abnormal current is broken.

A current for melting or breaking down the connected portion 40a of the film electrode 40, which current will be referred to as "breakdown current", is determined by the width of the lead-out electrode 30a, material thickness of the film electrode 40. These are selected appropriately in dependence on a value of the abnormal current to be broken, taking it into consideration that the internal electrode 40 is usually designed to have a thickness of 1–2 micrometers.

The width of the lead-out electrode 30a is preferably 50–800 micrometers. If it is smaller than 50 micrometers, electrical connection of the internal electrode with an external electrode cannot be sufficiently established. If it is larger than 800 micrometers, there is a problem that the abnormal current may not be broken.

The thickness of the film electrode 40 is preferably 0.5–50 micrometers. If it is larger than 50 micrometers, the breakdown current becomes high, for example, 10 amperes or more. If it is lower than 0.5 micrometers, it is difficult to select a comparatively high value of the breakdown current. Further, the capacitor resultantly has an equivalent series resistance (ERR) increased.

In order to obtain the ESR value, for example, several milli-ohms (mΩ) to 100 milli-ohms which is generally equal to that in a known stacked-type ceramic capacitor having no fuse element, the width of the lead-out electrode 30a and thickness of the film electrode 40 are preferably selected 300–800 micrometers and 2–50 micrometers. On the other hand, in order to obtain the higher ESR value such as 100 milli-ohms to 1 ohm, the width of the lead-out electrode 30a and thickness of the film electrode 40 are preferably selected 100–300 micrometers and 0.5–2 micrometers.

The thickness of the film electrode 40 can readily be controlled by use of a method for forming an electrode by coating a metallic powder paste and then baking the coated paste.

However, it is more preferable for thickness control to use metallo-organic compound paste in place of, or together with the metallic powder paste.

Usually, the internal electrode 30 is made of Ni, Ni-alloy, Pd, or Ag—Pd alloy. The internal electrode is formed by screen printing as described above. The thickness of the internal electrode after the ceramic body is baked is usually 1–2 micrometers. The film electrode 40 can be made of Ag, Pd, Cu, Ni, Sn, Zn, B, Pb or Cd, or alloy of metals selected therefrom.

When Ag—Pd alloy is used for the internal electrode 30, Ag powder paste is preferably coated and baked to form the film electrode 40. When 70% Ag—30% Pd (by weight) is used for the internal electrode 40, 80% Ag—20% Pd is used for the film electrode 40. On the other hand, when Ni, Ni-alloy, or Pd is used for the internal electrode 30, Cu powder paste may be coated and baked to form the film electrode 40. Thus, the film electrode 40 has a melting point lower than that of the internal electrode 30, so that the film electrode is melted prior to the internal electrode when the abnormal current flows.

Figure 2:
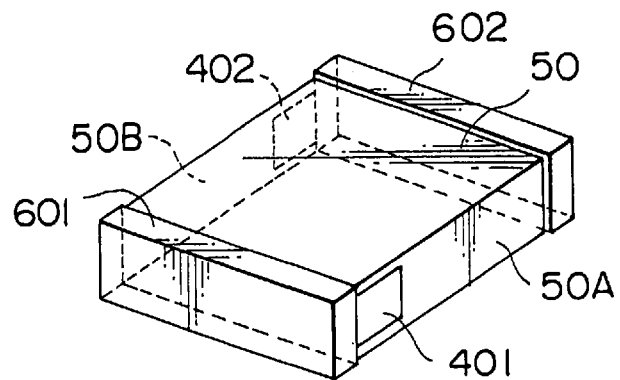
FIG. 2 is a perspective view of a stacked-type capacitor according to an embodiment of this invention.
Figure 3:
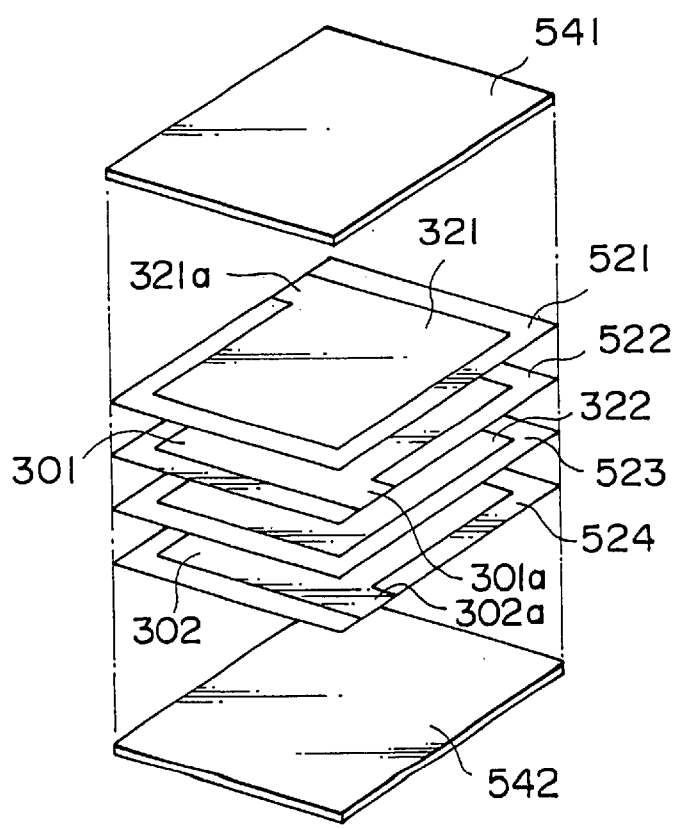
FIG. 3 is a perspective view of a ceramic body with internal electrodes in the capacitor of FIG. 2 but in a pre-assembled condition for illustrating an internal structure.
Figure 4:
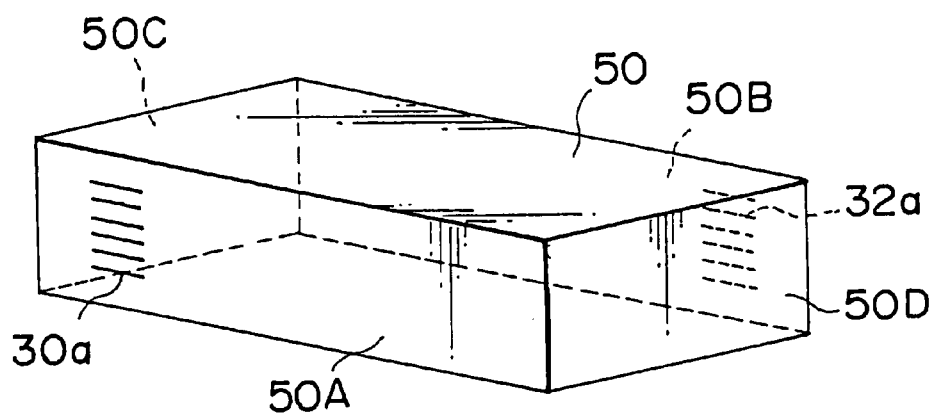
FIG. 4 is a perspective view of the ceramic body of FIG. 3 as assembled.

Referring to FIGS. 2–4, description will be made as to a stacked-type ceramic capacitor according to an embodiment. As shown in FIG. 2, the capacitor comprises a ceramic body 50 of a rectangular shape which has first and second side surfaces 50A and 50B opposite to each other and opposite ends, first and second film electrodes 401 and 402 deposited on the first and second side surfaces 50A and 50B, respectively, and first and second external electrodes 601 and 602 deposited on the opposite ends of the ceramic body 50. The first and second film electrodes 401 and 402 are partially overlapped and connected with the first and second external electrodes 601 and 602. The capacitor has a size of, for example, 3.2 mm×1.6 mm×1.6 mm to 5.7 mm×5.0 mm×5.0 mm.

Referring to FIG. 3, a plurality of ceramic green sheets 52<i>1</i>–52<i>n</i> (521–524 are only shown) are prepared with first internal electrodes 30 (301 and 302 are only shown) and second internal electrodes 32 (321 and 322 are only shown), respectively.

Dielectric powder of a complex perovskite compound powder is mixed with binder materials in an organic solvent to form ceramic slurry, and ceramic green sheets are formed therefrom by use of the doctor blade method. Each of the ceramic green sheets has a thickness of 30 micrometers and has a rectangular shape. Each of green sheets is formed by has a rectangular shape and a thickness of 30 micrometers. The first and second internal electrodes 30 and 32 are formed on the ceramic green sheets, respectively, by screen printing 70% Ag—30% Pd paste on the ceramic green sheets.

The first and second internal electrodes 30 and 32 have first lead-out electrodes 30<i>a</i> (301<i>a</i> and 302<i>a</i> are only shown) and second lead-out electrodes 32<i>a</i> (321<i>a</i> is only shown) which extend to opposite sides of the green sheets. Each of the first and the second lead-out electrodes 30<i>a</i> and 32<i>a</i> are adjusted to have a width of 500 micrometers.

The green sheets 52 (522 and 524 are only shown) having first internal electrodes 30 and green sheets 52 (521 and 523 are only shown) having the second internal electrodes 32 are alternately stacked between a top green sheet 541 and a base green sheet 542 to form a ceramic green body. The ceramic green body is fired, baked or sintered to form the ceramic body 50 as shown in FIG. 4. The ceramic body 50 has first lead-out electrodes 30<i>a</i> extending from the first internal electrodes to the first side surface 50A of the ceramic body 50 and second lead-out electrodes 32<i>a</i> extending from the second internal electrodes to the second side surface 50B of the ceramic body 50. Thus, the first and second lead-out electrodes 30<i>a</i> and 32<i>a</i> are exposed at their ends in the first and second side surfaces 50A and 50B, respectively.

Then, the first and second external electrodes 601 and 602 are formed on first and second ends 50C and 50D opposite to each other by coating and baking Ag paste thereon. Each of the first and second external electrodes 601 and 602 are formed to extend from the first and second end surfaces 50C and 50D to the top, bottom and first and second side surfaces 50A and 50B, as shown in FIG. 2.

A distance from the first external electrode 601 to the first lead-out electrodes 30<i>a</i> is determined to be equal to another distance from the second external electrode 602 to the second lead-out electrodes 32<i>a</i>.

Then, first and second film electrodes 401 and 402 are formed by coating and baking Ag paste on the first and second side surfaces 50A and 50B to overlap the first and second lead-out electrodes 30<i>a</i> and 32<i>a</i> and to partially overlap the first and second external electrodes 601 and 602, respectively. The coating is carried out by the screen printing.

Thus, the capacitor shown in FIG. 2 is completed.

The film electrodes 401 and 402 can preferably contain a glass forming element such as $SiO_2$, $Al_2O_3$ or $B_2O_3$ by mixing the element into the metallic paste. The resultant film electrodes can be protected from hot solder when the first and second external electrodes of the capacitor are soldered to an external circuit such as a printed circuit.

In place of the paste of the metallic powder, metallo-organic compound paste can be used for forming the first and second film electrodes 401 and 402. The metallo-organic compound paste comprises metallo-organic compound and organic solvent and resin in both of which the salt is resolved. The metallo-organic compound comprises organometallic composition and organic solvent in which the composition is resolved. The metal in the orgnometallic salt is same as that in the metallic powder paste.

The metallo-organic compound may preferably contain at least one of glass forming elements of Si, Al, and B, so as to protect the film electrodes from soldering.

Figure 5:
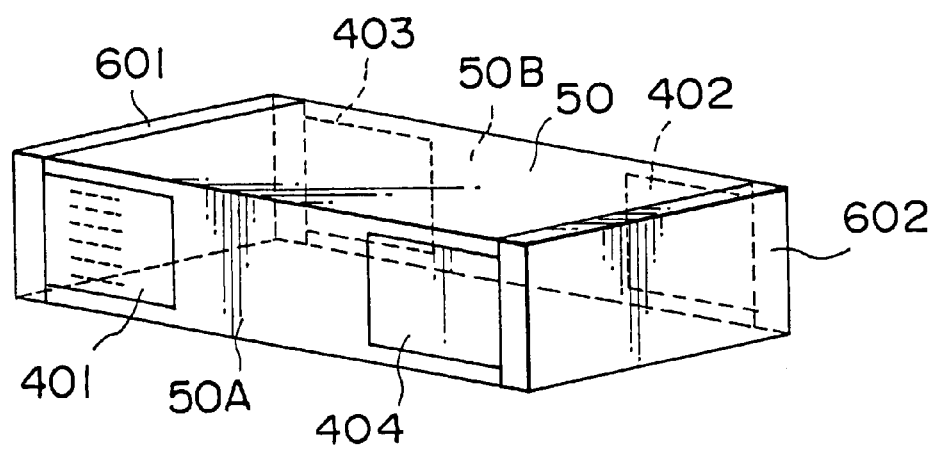
FIG. 5 is a perspective view of a modified one of the stacked-type capacitor of FIG. 2.

Referring to FIG. 5, the capacitor of FIG. 2 is modified by providing first and second dummy film electrodes 403 and 404 on the second and first side surfaces 50B and 50A of the ceramic body 50, respectively. The first and second dummy film electrodes 403 and 404 are positioned in symmetry with the first and second film electrodes 401 and 402, respectively. The first and second dummy film electrodes 403 and 404 are connected to the first and second external electrodes 601 and 602 but to no internal electrodes. Although the first and second dummy film electrodes 403 and 404 are electrically meaningless, use of the dummy electrodes makes production of the capacitor easy because it is not necessary to adjust an orientation of the ceramic body 50 for forming the film electrodes 401 and 402.

Samples of the capacitor of FIG. 2 were produced which have the fuse electrodes 40 different in thickness by use of the Ag powder paste. The width of the lead-out electrodes 30<i>a</i> and 32<i>a</i> were constant to be 500 micrometers.

Other samples were produced by use of the metallo-organic compound paste for forming the electrodes 40 of a thickness of 5 micrometers but were different in the width of the lead-out electrodes 30<i>a</i> and 32<i>a</i>.

Another sample was also produced by use of a mixture of the Ag powder paste and the metallo-organic compound paste at a rate of 1:1 for producing the film electrodes 40 having a thickness of 5 micrometer. The width of the lead-out electrodes 30<i>a</i> and 32<i>a</i> was 500 micronmeters.

For the all samples, measurement was carried out with respect to the breakdown current, the breakdown time, capacitance, and the ESR. The measured data are shown in Table 1.

TABLE 1

| Samples | Material of film electrode | Paste | Width of side edge [μm] | Thickness of film electrode [μm] | Capacitance (Rate to known one) | ESR (Rate to known one) | Breakdown |
|---|---|---|---|---|---|---|---|
| Known | Ag | metallic powder | — | — | — | — | — |
| 1 | | | 500 | 0.1 | unmeasurable | unmeasurable | ○ |
| 2 | | | 500 | 0.5 | 100% | 400% | ○ |
| 3 | | | 500 | 1 | 100% | 200% | ○ |
| 4 | | | 500 | 5 | 100% | 120% | ○ |

TABLE 1-continued

| Samples | Material of film electrode | Paste | Width of side edge [μm] | Thickness of film electrode [μm] | Capacitance (Rate to known one) | ESR (Rate to known one) | Break-down |
|---|---|---|---|---|---|---|---|
| 5 | | | 500 | 10 | 100% | 105% | ○ |
| 6 | | | 500 | 50 | 100% | 100% | ○ |
| 7 | | | 500 | 100 | 100% | 100% | X |
| 8 | | organometallic salt | 10 | 5 | unmeasurable | unmeasurable | — |
| 9 | | | 50 | 5 | not constant | 2000% | ○ |
| 10 | | | 100 | 5 | 100% | 500% | ○ |
| 11 | | | 500 | 5 | 100% | 120% | ○ |
| 12 | | | 1000 | 5 | 100% | 100% | X |
| 13 | | | 800 | 5 | 100% | 105% | ○ |
| 14 | | metallic powder + organometallic salt | 500 | 5 | 100% | 120% | ○ |

○: good
X: no good

In comparison, a known stacked-type ceramic capacitor having no film electrode but having the same structure and same sizes of various portions as the samples was made and subjected to measurements. In table 1, the capacitance and the ESR of those samples were shown by variation rate from the known capacitance.

Figure 6:
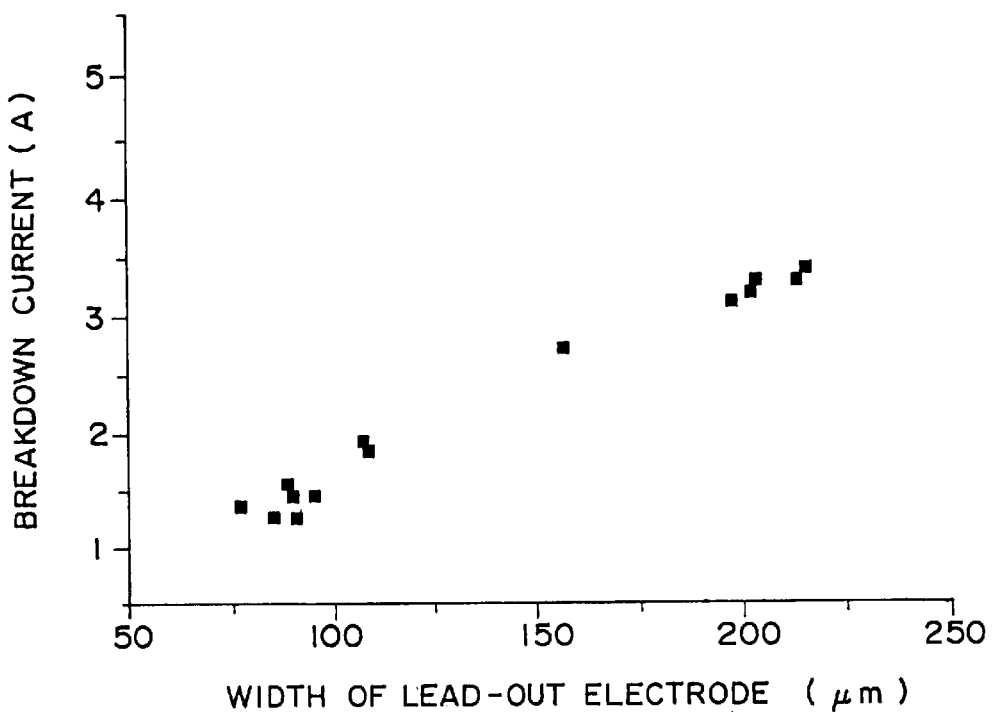
FIG. 6 is a graph showing test data of breakdown current to width of a lead-out electrode of an internal electrode connected to a film electrode for fuse in the stacked-type capacitor of FIG. 2.

FIG. 6 shows a relation between the width of the lead-out electrode 30a and the breakdown current.

From the test result, it is seen that samples 2–6, 9–11, 13 and 14 have good properties. Therefore, it is preferable that the thickness of the film electrode 40 is 0.5–50 micrometers while the width of lead-out electrode 30a and 32a being 50–800 micrometers.

Figure 7:
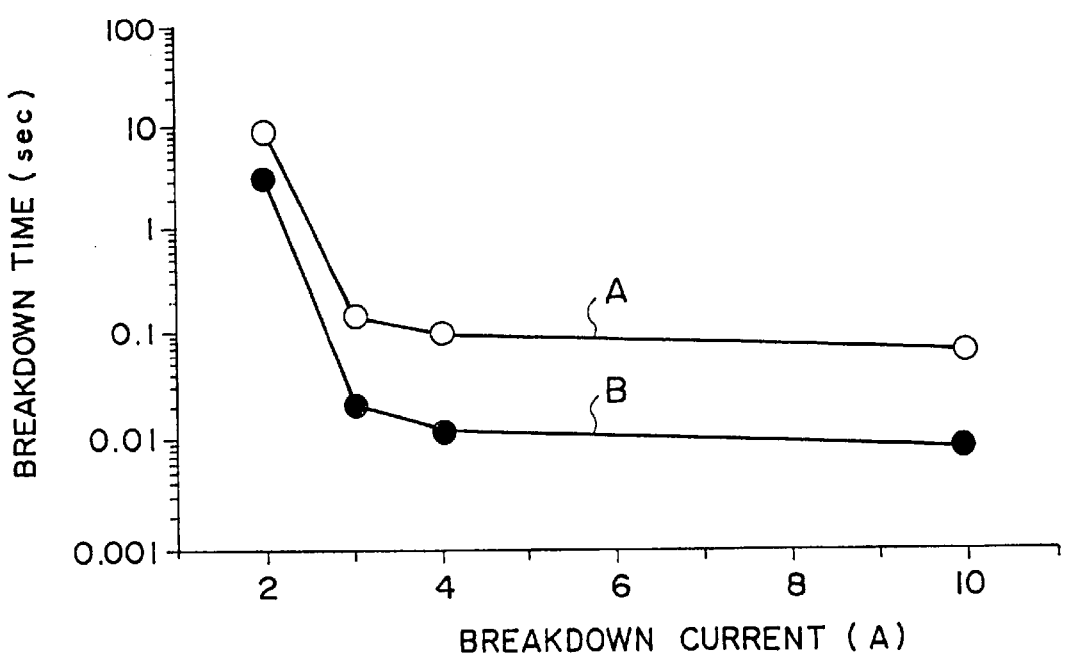
FIG. 7 is a graph showing test data of breakdown time to breakdown current.

FIG. 7 shows a relation between the breakdown current and the breakdown time with respect to film electrodes 40 formed by use of 80Ag—20Pd powder paste (curve A) and Ag—Pd organometallic (80Ag—20Pd) salt paste (curve B), respectively. From the result, it is seen that use of the metallo-organic compound paste is preferable in the breakdown time comparing use of the metallic powder paste.

Figure 8:
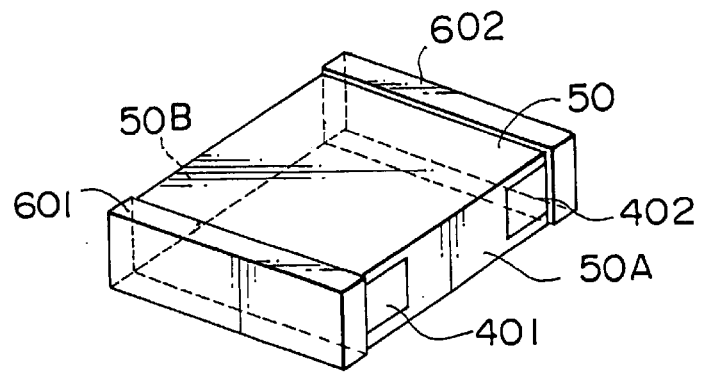
FIG. 8 is a perspective view of a stacked-type capacitor according t another embodiment.
Figure 9:
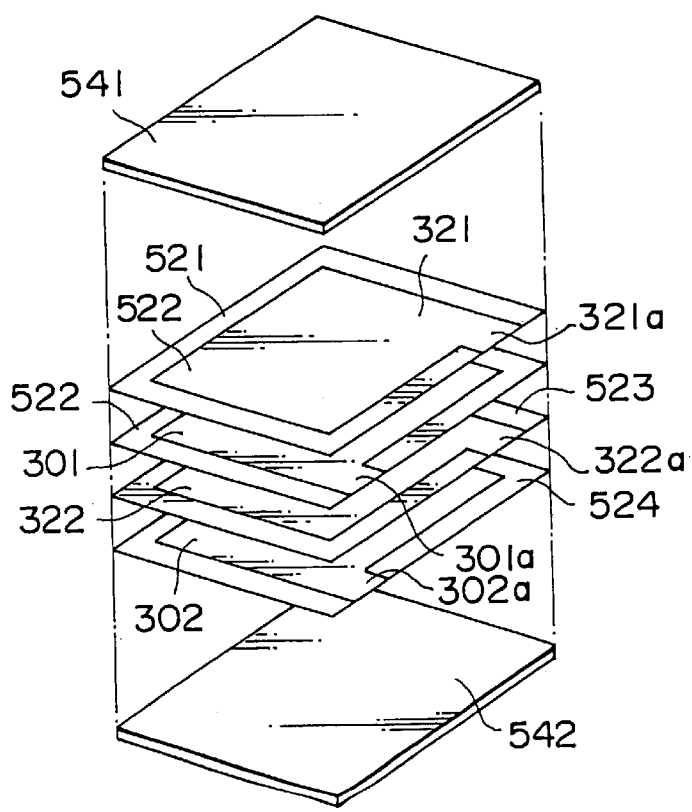
FIG. 9 is a perspective view of a ceramic body in the stacked-type capacitor of FIG. 8, which is similar to FIG. 3.

Referring to FIGS. 8 and 9, a stacked-type ceramic capacitor shown therein is similar to that of the capacitor shown in FIGS. 2–4 except that the first lead-out electrodes 30a and second lead-out electrodes 32a are formed on the same side surface 50A. The similar portions are shown by the same reference numerals in FIGS. 2–4 and are not described in detail.

Although it has been described in connection with the embodiments of FIGS. 2 and 8 that the external electrodes 60 formed prior to formation of the film electrodes 30 and 32, the external electrodes 60 can be formed after formation of the film electrodes 30 and 32.

Figure 10A:
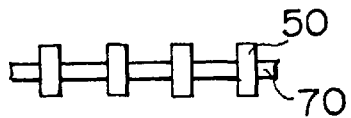
FIGS. 10A–10E shows different steps for forming an external electrode on the ceramic body having the film electrode.
Figure 10B:
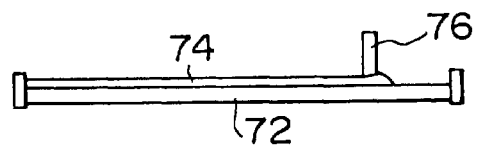
Figure 10C:
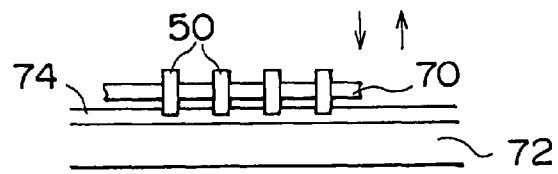
Figure 10D:
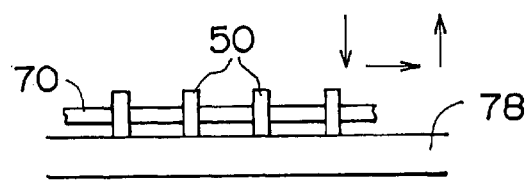
Figure 10E:
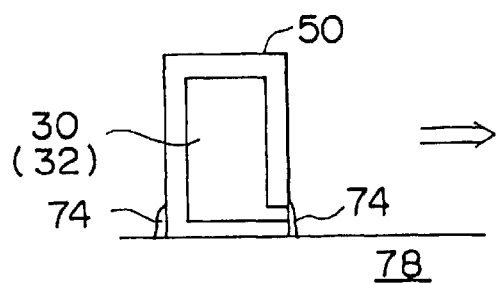
Figure 11:
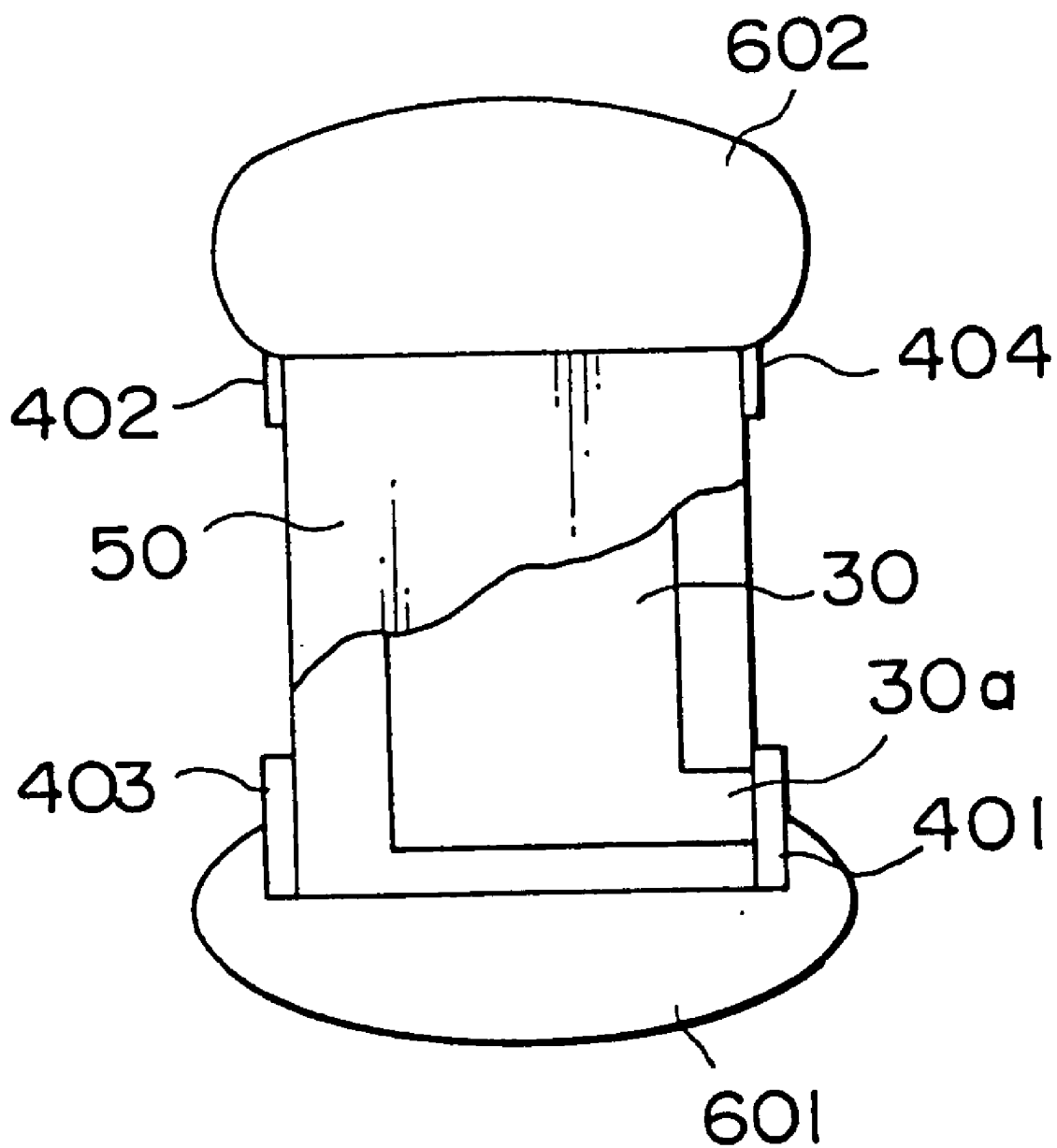
FIG. 11 is a partially cross-sectional view of the stacked-type ceramic capacitor with the external electrodes as formed by the steps of FIGS. 10A–10E.

Referring to FIGS. 10–10E, a plurality of ceramic bodies 50 are carried on a carrier 70 as shown in FIG. 10A While, a working table 72 is prepared to have a layer of the paste 74, for example, the organometallic paste extended on an upper surface thereof by use of a squeezing blade 76, as shown in FIG. 10B. The carrier 70 is moved to push one ends of the ceramic bodies 50 onto the paste layer 74, as shown in FIG. 10C. As a result, the paste 74 is attached to cover the lower end surface and the both side surfaces of the ceramic body 50 at the lower portion. Thereafter, the carrier 70 is transferred to another working table 76 which has a plane surface without no paste, as shown in FIG. 10D. The ceramic bodies 50 are pushed onto the plane surface of the working plate 76 and then moved laterally, as shown FIG. 10D. Thus, the paste 74 is removed form the lower end surface but attached onto the opposite side surfaces of the ceramic body 50 at lower portion thereof. After the paste 74 is cured, the similar operation is carried out for the other end of the ceramic body 50. Thus, film electrodes 401 and 402 and dummy film electrodes 403 and 404 are formed on the ceramic body 50. Then, external electrodes 601 and 602 are formed on the opposite ends of the ceramic body, and then, baked to complete the capacitor, as shown in FIG. 11.

Referring to FIGS. 12–15, a capacitor according to another embodiment shown therein is similar to the embodiment of FIGS. 2 and 8a except that first internal electrodes 30 and second internal electrodes 32 have two opposite lead-out electrodes 30a, 30b, 32a and 32b, and that the film electrodes are formed together with the external electrodes in one body. The similar parts are shown by same reference numerals and are not described in detail.

Figure 14:
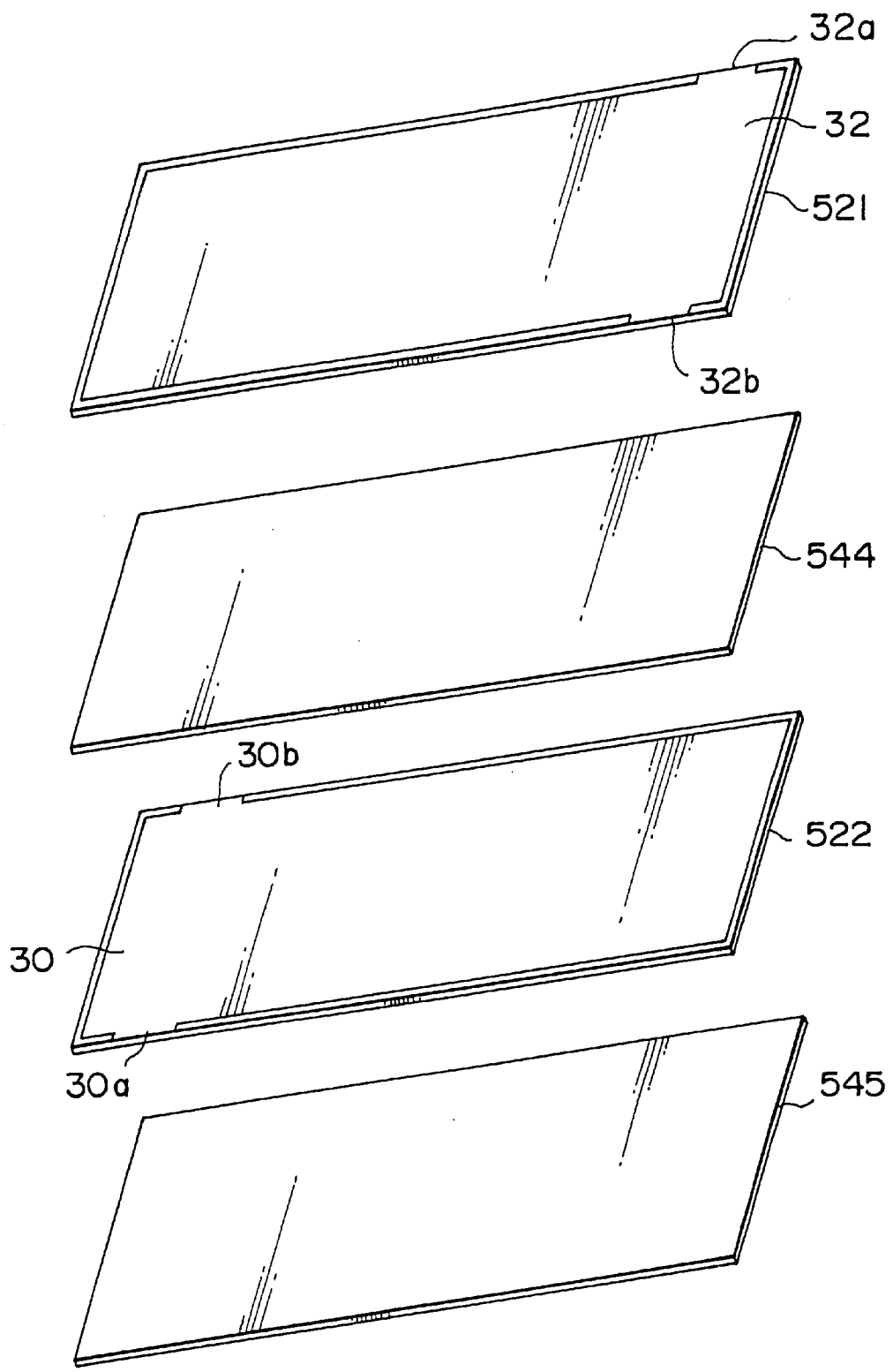
FIG. 14 is a perspective of a ceramic body in the capacitor of FIGS. 12 and 13, which is similar to FIG. 3.
Figure 15:
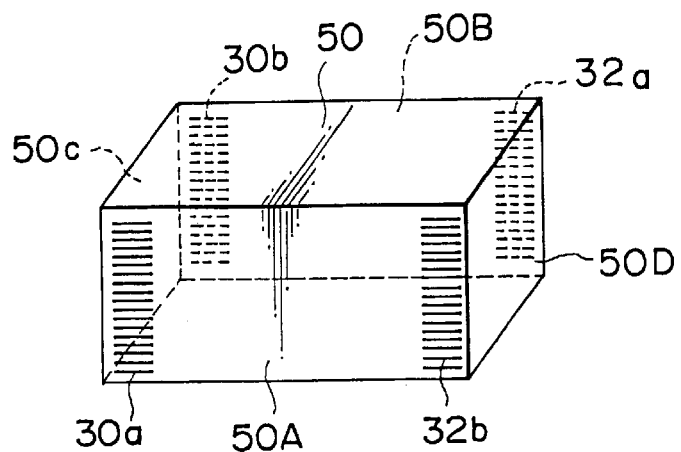
FIG. 15 is a perspective view of the ceramic body as assembled from FIG. 14.

As is well shown in FIG. 14, a first internal electrode 30 is formed on a green sheet 522 and has two lead-out electrodes 30a and 30b extending to opposite sides of the green sheet in the vicinity of an end of the green sheet. A second internal electrodes 32 is also formed on another green sheet 521 and has two lead-out electrodes 32a and 32b extending to opposite sides of the green sheet in the vicinity of an opposite end of the green sheet. A plurality of green sheets (only two 521 and 522 are shown) having first internal electrodes 30 and second internal electrodes 32 are alternately stacked to form the ceramic body 50 as shown in FIG. 15. In the embodiment, green sheets 544 and 545 having no electrodes are interposed between adjacent ones of green sheets having internal electrodes, so as to adjust the capacitance. However, those green sheets 544 and 545 having no electrodes can be omitted as shown in FIG. 3, if they are not necessary. Further, the top and base plates (541 and 542 in FIG. 3) are not shown but are used.

Referring to FIG. 15, lead-out electrodes 30a and 30b are exposed in the first and second side surfaces 50A and 50B of the ceramic body 50, respectively, in the vicinity of the first end 50C. Also lead-out electrodes 32a and 32b are exposed in the second and first side surfaces 50B and 50A of the ceramic body 50, respectively, in the vicinity of the second end 50D.

Then, first and second external electrodes 801 and 82 are formed on portions in the vicinity of the first and second ends 50C and 50D, respectively, by use of the paste for forming the film electrodes as described above, as shown in FIG. 12 and 13. In order to protect the external electrode 801 and 802 from soldering when the capacitor is mounted on an external circuit of a printed circuit board, the metallic powder paste used should contain the glass forming elements such as $SiO_2$, $Al_2O_3$, or $B_2O_3$. While the metallo-organic compound paste used should also contain such as glass forming elements Si, Al, or B.

The portions 801a and 801b of the first external electrode 801 formed on the first and second side surfaces 50A and 50B of the ceramic body 50 overlie and are connected to the lead-out electrodes 30a and 30b, respectively, and serve as the film electrode 40 for breaking the abnormal current. On the other hand, the portions 802a and 802b of the second external electrode 802 formed on the second and first side surfaces 50B and 50A of the ceramic body 50 overlie and are connected to the lead-out electrodes 32a and 32b, respectively, and serve as the film electrode 40 for breaking out the abnormal current.

Figure 16:
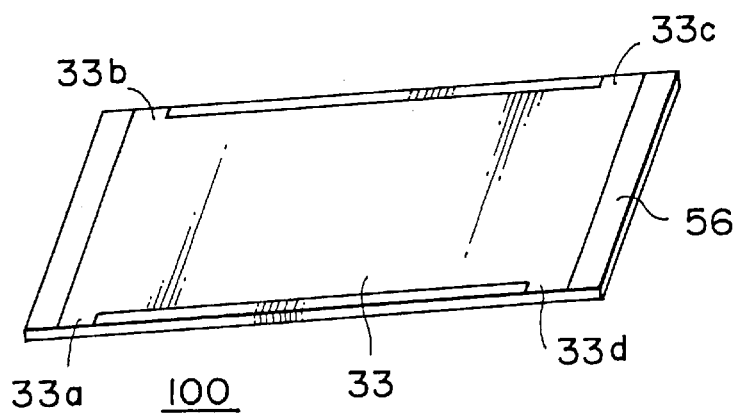
FIG. 16 is a perspective view of a test piece of an internal electrode for establishing a short circuit between two external electrodes.

Referring to FIG. 16, a test piece 100 was formed for confirmation of fuse function of the film electrodes. The test piece 100 comprises a ceramic green sheet 56, and an internal electrode 33 formed on the green sheet 56. The internal electrode 33 has two opposite lead-out electrodes 33a and 33b extending to opposite sides of the green sheet 56 in the vicinity of one end thereof and another two opposite lead-out electrodes 33c and 33d extending to opposite sides of the green sheet 56 in the vicinity of the opposite end thereof.

Figure 12:
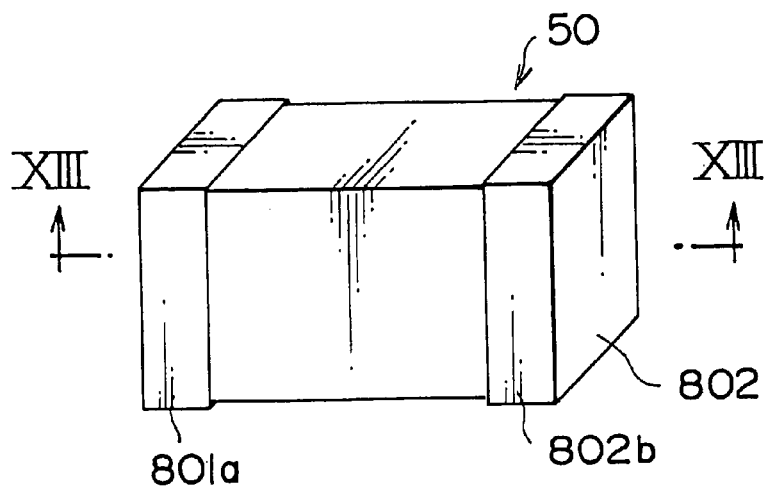
FIG. 12 is a perspective view of a stacked type capacitor according to another embodiment.
Figure 13:
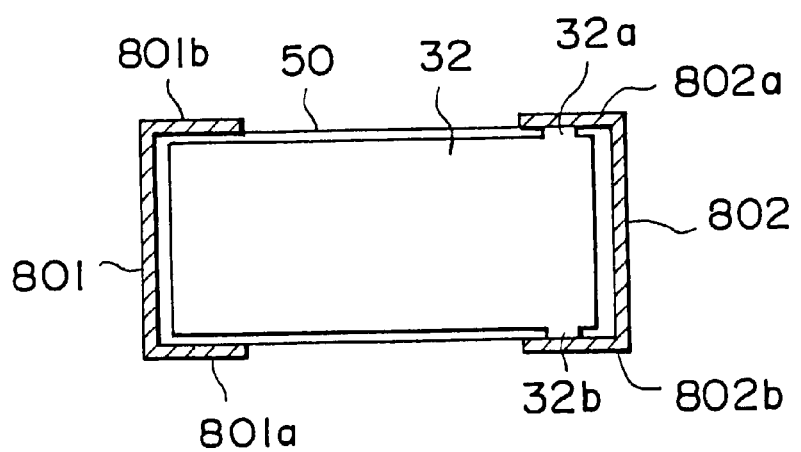
FIG. 13 is a sectional view taken a line XIII—XIII in FIG. 12.

The test piece 100 is stacked together with a plurality of green sheets 521 and 522 (FIG. 14) having first and second internal electrodes to form the ceramic body 50 as shown in FIG. 15 but including the test piece. Then, the external electrodes 801 and 802 are formed as shown in FIGS. 12 and 13. Thus, the two lead-out electrodes 33a and 33b are connected to the external electrode 801, and other two lead-out electrodes 33c and 33d are connected to the second external electrode 802. Therefore, the first and the second external electrodes 801 and 802 are short-circuited through the test piece 100. This is a simulation as if adjacent ones of the first and the second internal electrodes are short-circuited.

A DC source was connected across the external electrodes 801 and 802 to flow a DC current across the external electrodes 801 and 802. When the DC current was increased up to 3 amperes, it rapidly became zero. Thereafter, it was impossible to flow the current through the capacitor. The capacitance, a dielectric loss and an insulation resistance of the capacitance were measured by use of an LCR meter. As a result, it was confirmed that they had normal values. This means that the current flow was broken and that the internal electrode 33 of the test piece 100 is separated from the connection with the external electrodes.

Figure 17:
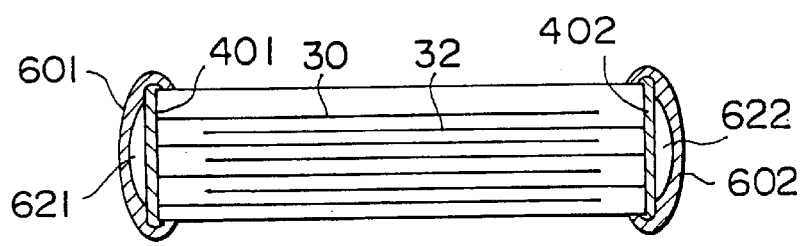
FIG. 17 is a sectional view of a stacked-type capacitor according to another embodiment.
Figure 18:
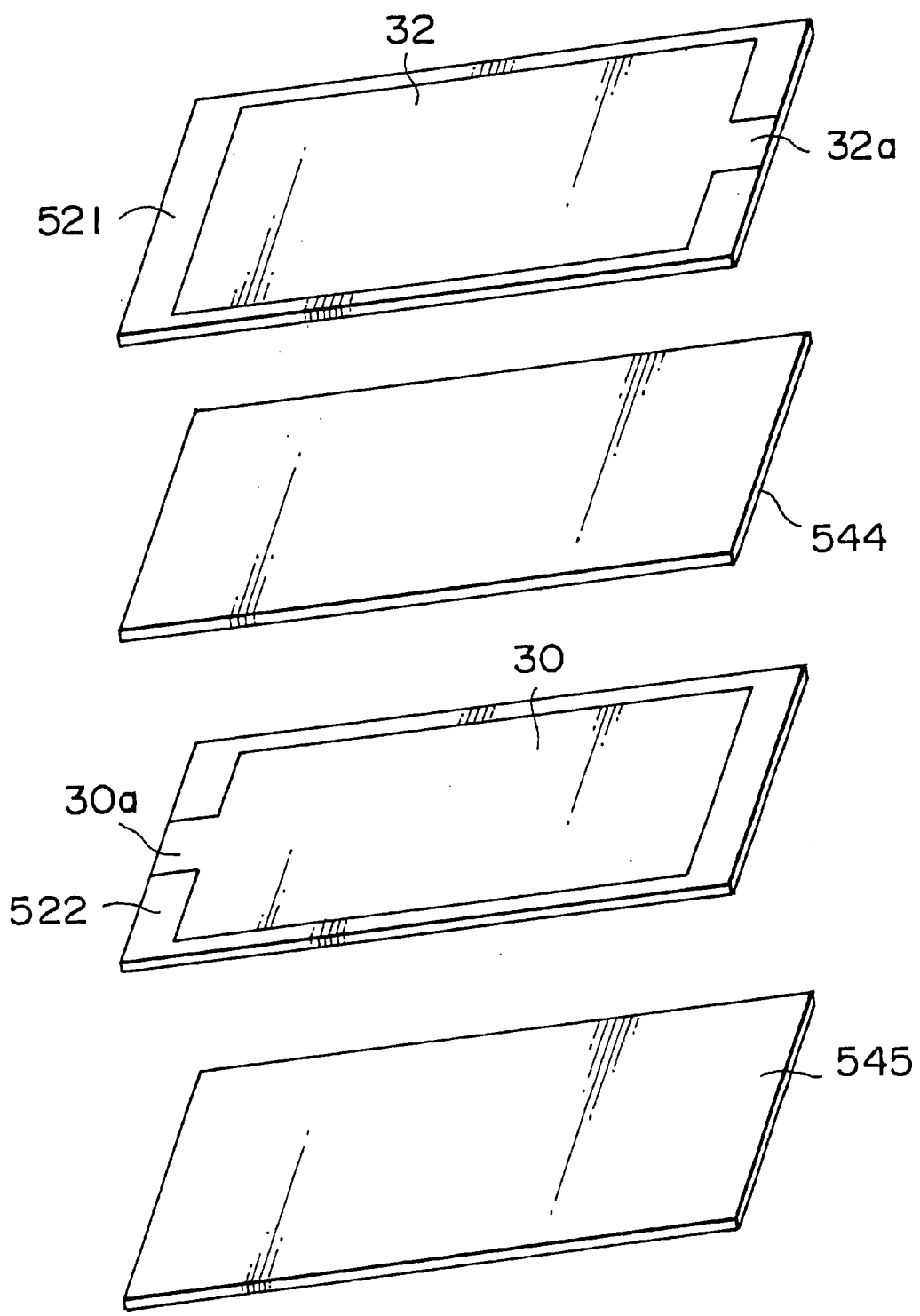
FIG. 18 is a perspective of a ceramic body in the capacitor of FIG. 17, which is similar to FIG. 3.
Figure 19:
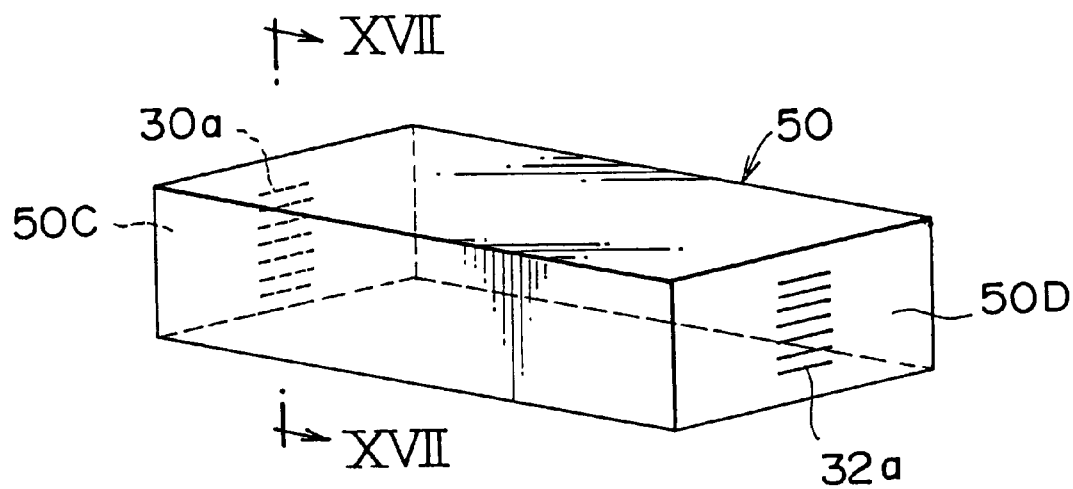
FIG. 19 is a perspective view of the ceramic body as assembled from FIG. 18.

Referring to FIGS. 17–19, a capacitor according to another embodiment shown therein are also similar to that in FIG. 2, except that the lead-out electrodes 30a and 32a are exposed in not the side surfaces 50A and 50B but in the end surfaces 50C and 50D, respectively. Therefore, the film electrodes 401 and 402 are also formed on the end surfaces 50C and 50D, respectively. The external electrodes 601 and 602 are formed on the film electrodes 401 and 402, respectively, but with partial hollow spaces 621 and 622 between the film electrodes and the external electrodes 401–601 and 402 and 602, respectively. The hollow spaces 621 and 622 are for permitting the film electrodes to melt by the abnormal current and receiving the melted metal.

Figure 20:
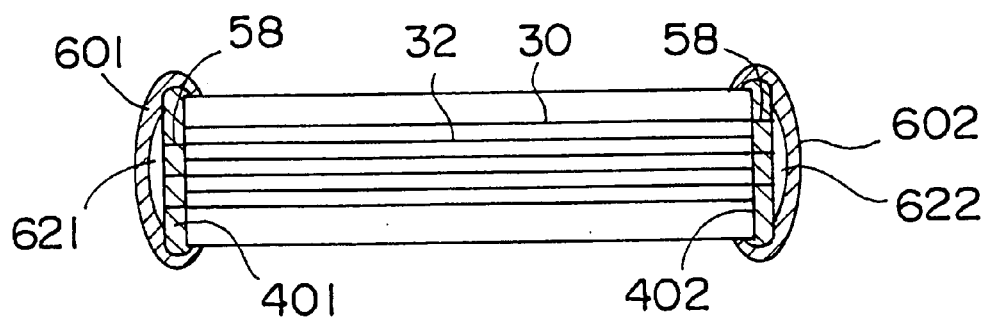
FIG. 20 is a sectional view of a modified capacitor of the capacitor of FIG. 17.

Referring to FIG. 20, a modification of the capacitor of FIGS. 17–19 is shown where the internal electrode 30 and 32 have opposite lead-out electrodes led out to the opposite ends 50C and 50D of the ceramic body 50. One of the opposite lead-out electrodes of the internal electrode 30 and one of the opposite lead-out electrodes of the internal electrodes 32 are coated with insulators 58 on the end surfaces 50D and 50C, respectively.

Figure 21:
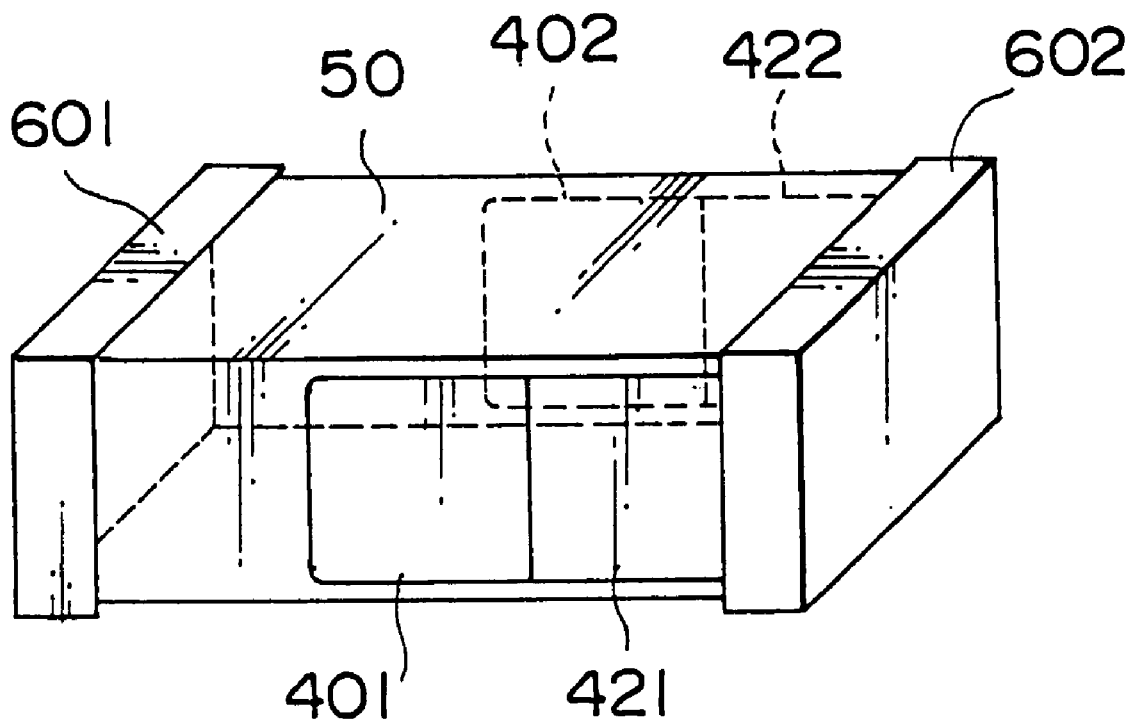
FIG. 21 is a perspective view of a stacked type capacitor according to another embodiment.
Figure 22:
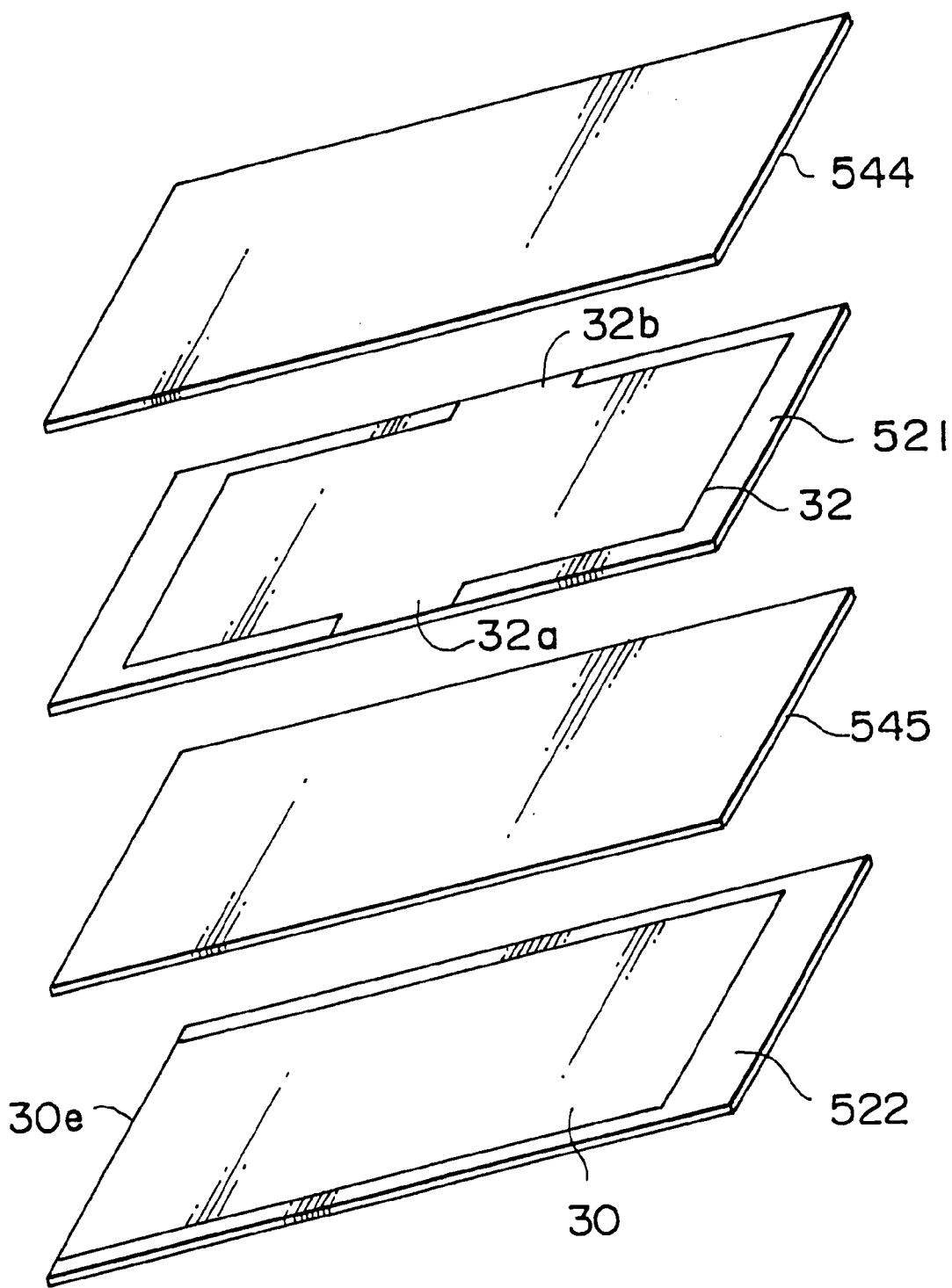
FIG. 22 is a perspective of a ceramic body in the capacitor of FIG. 21, which is similar to FIG. 3.
Figure 23:
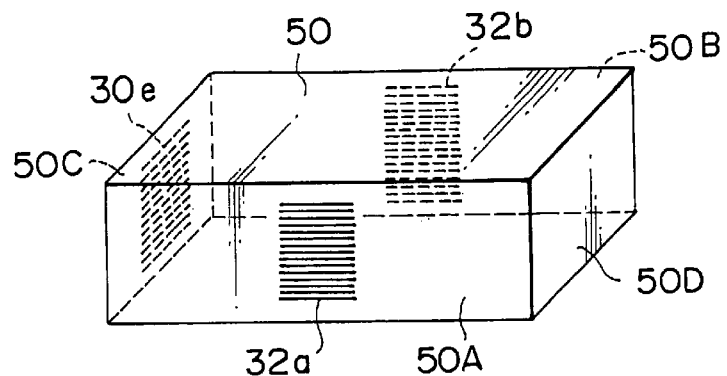
FIG. 23 is a perspective view of the ceramic body as assembled from FIG. 22.

Referring to FIGS. 21–23, a capacitor according to another embodiment shown therein is also similar to the capacitor of FIGS. 12–15, except that the lead-out electrodes 32a and 32b of the second internal electrode 32 are led out in the side surfaces 50A and 50B of the ceramic body 50, respectively, at intermediate position between the opposite ends 50C and 50D of the ceramic body 50. While, the first internal electrode 30 has no lead-out electrode but one end thereof being exposed at 30e in one end 50C of the ceramic body 50 as shown in FIGS. 22 and 23.

The external electrodes 601 and 602 are formed on the portions of the opposite ends 50C and 50D, respectively. Therefore, the external electrode 601 is connected to the first internal electrodes 30, directly, as shown in FIG. 21. Film electrodes 401 and 402 are formed on the side surfaces 50A and 50B of the ceramic body 50 at positions in which the lead-out electrodes 32a and 32b are exposed. Further, connecting electrodes 421 and 422 are also formed on side surfaces 50A and 50B, respectively, to connect the film electrodes 401 and 402 with the external electrode 602. Thus, the second internal electrodes are connected to the external electrode 602 through the film electrodes 401 and 402 and connecting electrodes 421 and 422, as shown in FIG. 21.

The connecting electrodes 421 and 422 may be made from the same paste of, or different paste from, the film electrodes 401 and 402.

Figure 24:
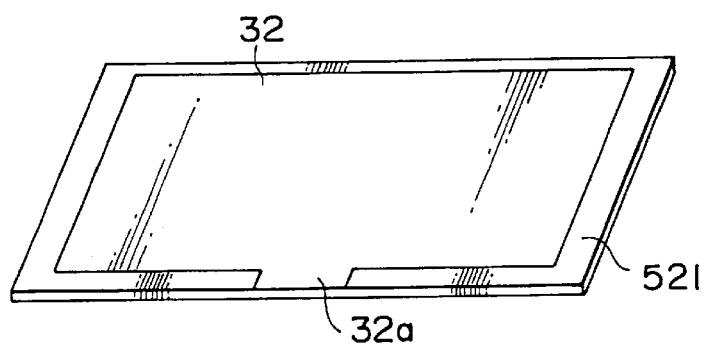
FIG. 24 is a perspective view of a modified shape of the first internal electrode in FIG. 22.

Referring to FIG. 24, a modification of the second internal electrode is shown therein and has the lead-out electrode 32a alone with the other lead-out electrode (32b in FIG. 22) being not formed. Therefore, the film electrodes 402 and connecting electrode 422 in FIG. 21 can be omitted but may be provided as dummy ones.

Figure 25:
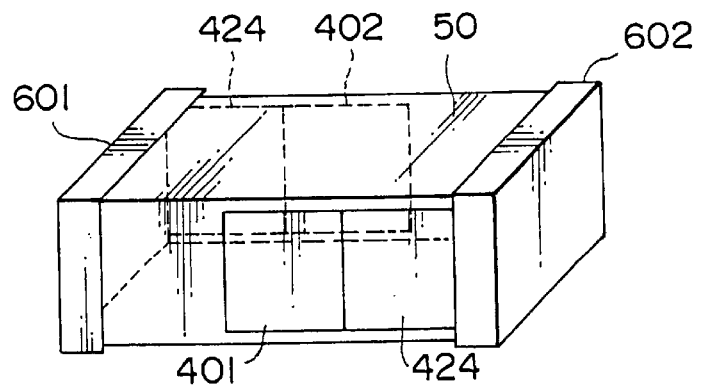
FIG. 25 is a perspective view of a stacked type capacitor according to another embodiment.
Figure 26:
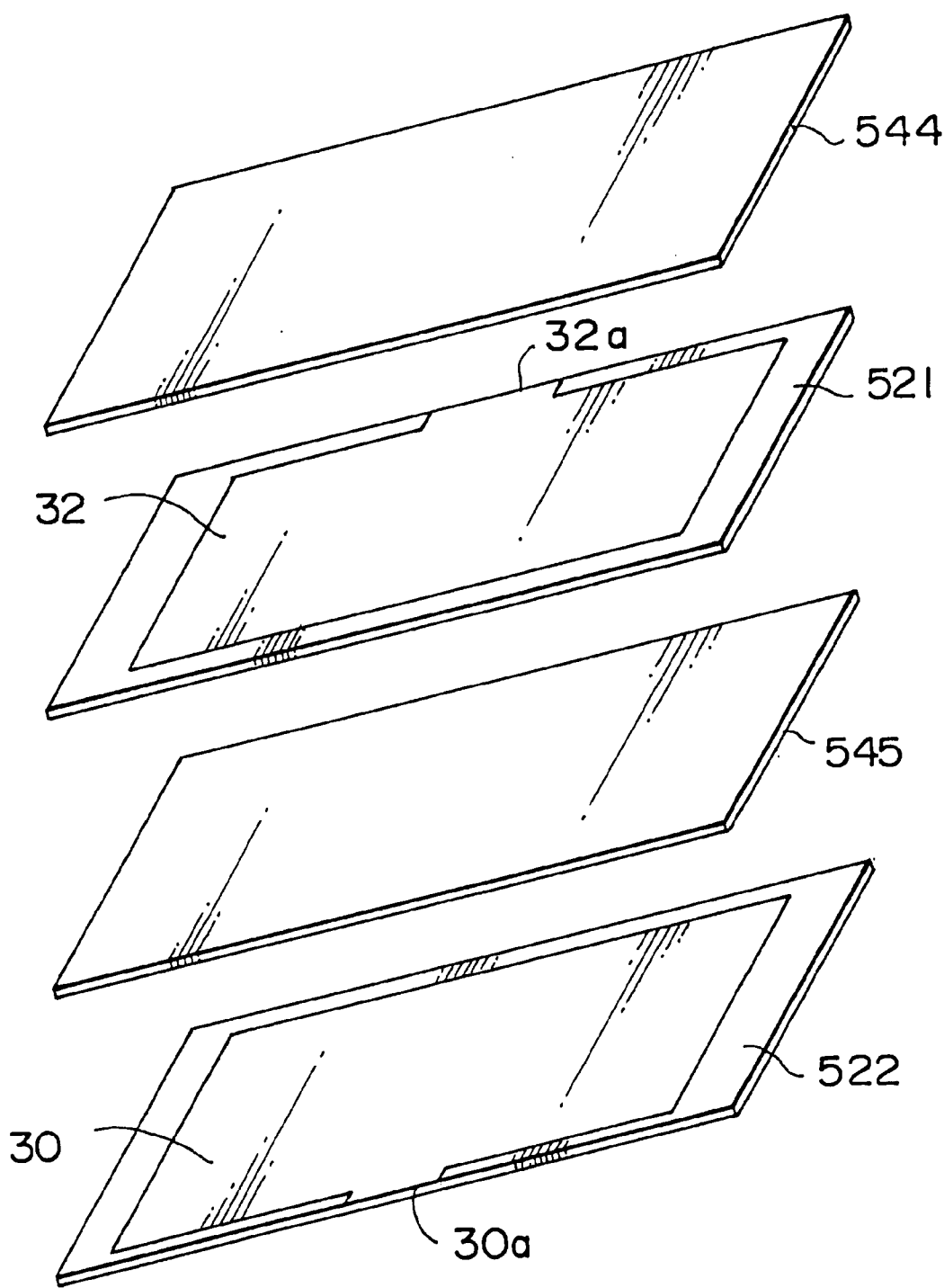
FIG. 26 is a perspective of a ceramic body in the capacitor of FIG. 25, which is similar to FIG. 3.
Figure 27:
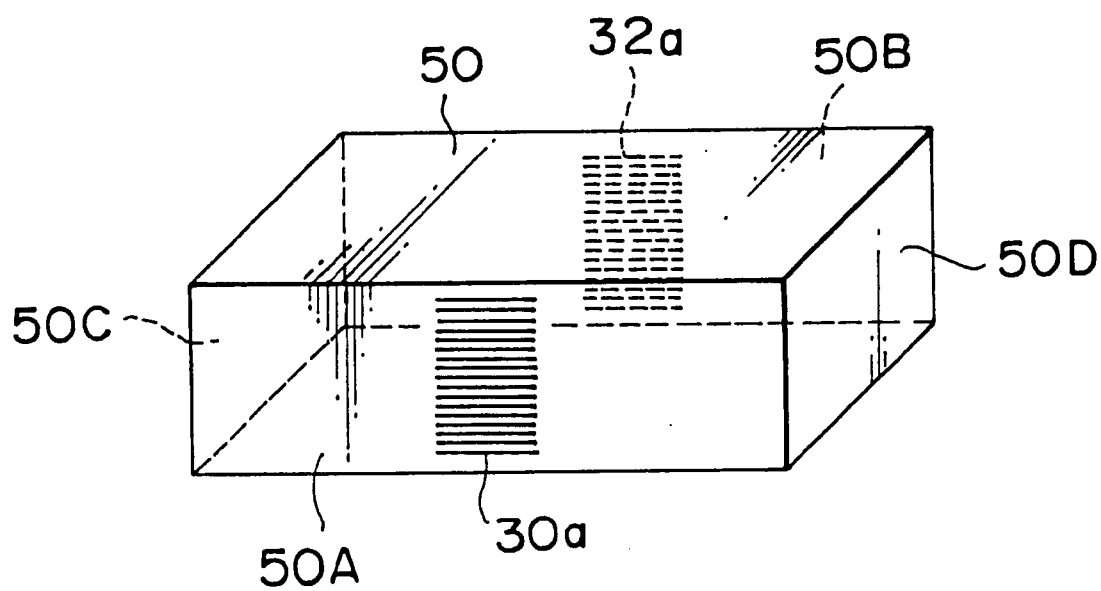
FIG. 27 is a perspective view of the ceramic body as assembled from FIG. 26.

Referring to FIGS. 25–27, a capacitor is a modification of the FIG. 2. The similar portions are shown by the same reference numerals. The lead-out electrodes 30a and 32a of the first and the second internal electrodes 30 and 32 are exposed in the side surfaces 50A and 50B of the ceramic body 50 at positions intermediate between the opposite ends 50C and 50D of the ceramic body 50. Therefore, film electrodes 401 and 402 are also formed on the side surfaces 50A and 50B at the intermediate positions, and connecting electrodes 423 and 424 are formed on the side surfaces 50A and 50B, respectively. The connecting electrodes 423 and 424 connects the film electrodes 401 and 402 with external electrodes 601 and 602 formed on the opposite ends of the ceramic body 50, respectively.

Two samples (example 1 and example 2) of the capacitors of FIGS. 21–23 and FIGS. 25–27 were produced. The lead-out electrodes 30a, 30b, 32a and 32b were formed to have a width of 400 micrometers, and the film electrodes 401 and 402 were made by coating and baking Ag powder paste including $SiO_2$—$B_2O_3$ glass powder to have a thickness of 5 micrometers after baked. The connecting electrodes 423 and 424 were made by coating and baking Ag powder paste.

Figure 28:
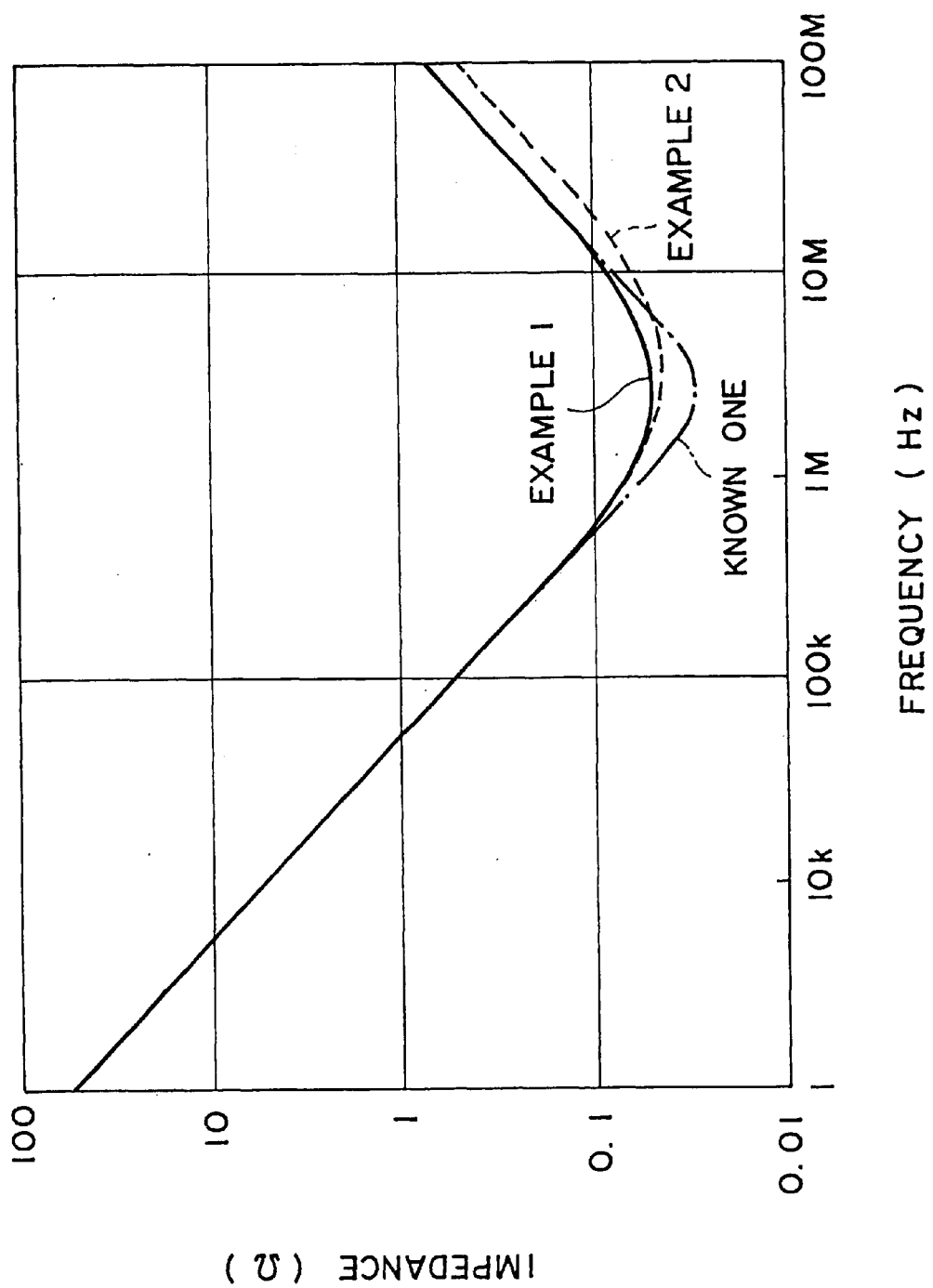
FIG. 28 shows frequency to impedance characteristics of the stacked-type capacitor of FIG. 21 and FIG. 25 in comparison with a known stacked type capacitor without fuse function.

The samples were subjected to a measurement of an impedance-frequency characteristic. The measured result is shown in FIG. 28. For comparison, the figure shows a impedance-frequency characteristic of a known capacitor having the same size and same capacity but with no film electrode for fuse function.

In FIG. 28, ESR is corresponding to the impedance at the lower portions of the characteristic curves. It is seen that examples 1 and 2 according to this invention have ESR substantially equivalent to that of known capacitor although the former is slightly higher than the latter.

In the embodiments described above, although only one ceramic material has been used, it should be noted that various ceramic materials known in the prior art can be used in this invention.

This invention has been described as to embodiments for the stacked-type ceramic capacitors, but it will be understood by those skilled in the art that the present invention can be used for other stacked-type ceramic electronic devices such as stacked-type ceramic actuators, varistors and others.

Industrial Applicability

According to this invention, a stacked-type electronic device with fuse function can be obtained which is small in size, simple in structure, easy in production, and low in cost.

What is claimed is:

1. A stacked-type electronic device comprising:
   a ceramic body of a ceramic material having an outer surface including a side surface;
   a set of internal electrodes disposed in said ceramic body and extending in parallel with and spaced from each other by said ceramic material, said internal electrodes having individual lead-out electrodes extending therefrom to respective ends exposed in said side surface;
   an external electrode mounted on said ceramic body for connecting to an external electric circuit;
   a separately formed film electrode connected to said external electrode, said film electrode being deposited on said side surface and overlying end surfaces of said individual lead-out electrodes in common to be directly connected to said leadout electrodes.

2. A stacked-type electronic device as claimed in claim 1, wherein said film electrode comprises metallic material having a melting point lower than that of said internal electrodes.

3. A stacked-type electronic device as claimed in claim 1, wherein said film electrode has a thickness of 0.5–50 micrometer ($\mu$m).

4. A stacked-type electronic device as claimed in claim 1, wherein each of said lead-out electrodes has a width of 50–800 micrometer ($\mu$m).

5. A stacked-type electronic device as claimed in claim 1 wherein said metallic material is at least one selected from a group consisting of Ag, Pd, Cu, Ni, Sn, Zn, Bi and Cd.

6. A stacked-type electronic device as claimed claim 1, wherein said film electrode comprises a backed film formed by an electrode metal paste which is coated on said side surface and is then baked.

7. A stacked-type electronic device as claimed in claim 6, wherein said electrode metal paste is a metallic powder paste comprising electrode metallic powder and a carrier solvent suspending said powder therein.

8. A stacked-type electronic device as claimed in claim 7, wherein said metallic powder paste further contains at least one selected from glass forming elements of $SiO_2$, $Al_2O_3$ and $B_2O_3$.

9. A stacked-type electronic device as claimed in claim 6, wherein:
   said electrode metal paste is a metallo-organic compound paste which comprises resinate of metallo-organic compound/organometallic compound and organic solvent resolving the resinate therein, and
   said resinate of the metallo-organic compound/organometallic compound comprises the metallo-organic compound/organometallic compound and resin added to the metallo-organic compound/organometallic compound.

10. A stacked-type electronic device as claimed in claim 9, wherein said metallo-organic compound/organometallic compound contains at least one of glass forming elements of Si, Al, and B.

11. A stacked-type electronic device as claimed in claim 6, wherein:
    said electrode metallic paste is a mixed paste which comprises a metallic powder paste and a metallo-organic compound paste mixed with said metallic powder paste,
    said metallic powder paste comprises electrode metallic powder and a carrier solvent suspending said powder therein,
    said metallo-organic compound paste comprises resinate of metallo-organic compound/organometallic compound and organic solvent resolving the resinate therein, and
    said resinate of the metallo-organic compound/organometallic compound comprises the metallo-organic compound/organometallic compound and resin added to the metallo-organic compound/organometallic compound.

12. A stacked-type electronic device as claimed in claim 11, wherein said metallic powder paste further contains at least one selected from glass forming elements of $SiO_2$, $Al_2O_3$ and $B_2O_3$.

13. A stacked-type electronic device as claimed in claim 11, wherein said metallo-organic compound contains at least one of glass forming elements of Si, Al, and B.

14. A stacked-type electronic device as claimed in claim 1, wherein said external electrode overlaps said film electrode.

15. A stacked-type electronic device as claimed in claim 14, wherein said external electrode and said film electrode are made of the same material.

16. A stacked-type electronic device as claimed in claim 14, wherein said external electrode and said film electrode are spaced from each other by a hollow space formed therebetween.

17. A stacked-type electronic device as claimed in claim 14, which further comprises an insulating glass layer partially interposed between said external electrode and said film electrode.

18. A stacked-type electronic device as claimed in claim 1, wherein said external electrode is formed at a position on said outer surface generally different from said film electrode.

19. A stacked-type electronic device as claimed in claim 18, wherein said external electrode and said film electrode are located at spaced positions on said outer surface, and a connecting electrode is deposited on said outer surface between said spaced positions and connecting said external electrode with said film electrode.

20. A stacked-type electronic device as claimed in claim 18, wherein said external electrode and said film electrode are partially but slightly overlapped to each other.

21. A stacked-type electronic device as claimed in claim 20, wherein said film electrode is covered with a protective glass layer, and said protective glass layer has a melting point lower than that of said film electrode but which is higher than a soldering temperature for soldering said external electrode to said external circuit.

22. A stacked-type electronic device as claimed in claim 1, wherein:

said side surface of said ceramic body, said set of internal electrodes, said lead-out electrodes, said external electrode and said film electrode comprise a first side surface, a first set of internal electrodes, first lead-out electrodes, a first external electrode, and a first film electrode, respectively, a second set of internal electrodes are disposed in said ceramic body, said second internal electrodes having individual second lead-out electrodes with extended ends exposed in said outer surface of said ceramic body at positions spaced from said first lead-out electrodes and said first external electrode, and a second external electrode is formed on said ceramic body and spaced from said first lead-out electrodes and said first external electrode but electrically connected to said second set of internal electrodes in common.

23. A stacked-type electronic device as claimed in claim 22, which further comprises a second film electrode connected to said second external electrode, said second film electrode being deposited on said outer surface and overlying end surfaces of said individual second lead-out electrodes in common to be directly connected to said second lead-out electrodes.

24. A stacked-type electronic device as claimed in claim 23, wherein said outer surface of said ceramic body comprises said first side surface and two opposite end surfaces at opposite ends of said first side surface, and said first and second external electrodes are formed on said first and second end surfaces.

25. A stacked-type electronic device as claimed in claim 24, wherein said second lead-out electrodes are exposed in said first side surface, and a distance between said second lead-out electrodes and said second external electrode equals a distance between said first lead-out electrodes and said first external electrode.

26. A stacked-type electronic device as claimed in claim 24, wherein said outer surface of said ceramic body further comprises a second side surface disposed opposite to said first side surface and between said first and second end surfaces, and said second lead-out electrodes are exposed in said second side surface.

27. A stacked-type electronic device as claimed in claim 26, which further comprises first and second dummy film electrodes disposed on said second and said first side surfaces opposite to each other and at positions opposite to said first and said second film electrodes, respectively.

28. A stacked-type electronic device as claimed in claim 22, which is a stacked-type capacitor wherein each of said first set of internal electrodes and each of said second set of internal electrodes are alternatively disposed in said ceramic body.

29. A stacked-type electronic device as claimed in claim 22, which is a stacked-type piezoelectric ceramic actuator wherein each of said first set of internal electrodes and each of said second set of internal electrodes are alternatively disposed in said ceramic body, and said ceramic body is polarized in a stacked direction between adjacent electrodes.

* * * * *